United States Patent [19]

Noguchi et al.

[11] Patent Number: 5,211,761
[45] Date of Patent: May 18, 1993

[54] PHOTOVOLTAIC DEVICE AND MANUFACTURING METHOD THEREOF

[75] Inventors: Shigeru Noguchi, Hirakata; Hiroshi Iwata, Neyagawa; Keiichi Sano, Takatsuki, all of Japan

[73] Assignee: Sanyo Electric Co., Ltd., Moriguchi, Japan

[21] Appl. No.: 722,949

[22] Filed: Jun. 28, 1991

[30] Foreign Application Priority Data

Jun. 29, 1990 [JP] Japan .................................. 2-173867
Jul. 11, 1990 [JP] Japan .................................. 2-183742

[51] Int. Cl.$^5$ ..................... H01L 31/04; H01L 31/18; H01L 31/0392
[52] U.S. Cl. .......................................... 136/258; 437/4; 437/89; 437/92; 437/967
[58] Field of Search ............... 136/258 PC; 437/4, 89, 437/92, 967

[56] References Cited

U.S. PATENT DOCUMENTS

| | | | |
|---|---|---|---|
| 4,401,840 | 8/1983 | Chitre | 136/258 PC |
| 4,571,448 | 2/1986 | Barnett | 136/259 |
| 4,677,250 | 6/1987 | Barnett et al. | 136/258 |
| 5,053,355 | 10/1991 | von Campe | 437/114 |
| 5,057,163 | 10/1991 | Barnett et al. | 136/258 PC |
| 5,087,296 | 2/1992 | Kondo et al. | 136/258 |
| 5,094,697 | 3/1992 | Takabayashi et al. | 136/249 TJ |
| 5,098,850 | 3/1992 | Nishida et al. | 437/4 |

OTHER PUBLICATIONS

"Solution growth of poly-Si thin films for solar cells" in the Extended Abstracts (The 50th Autumn Meeting, 1989); the Japan Society of Applied Physics, p. 567.

*Primary Examiner*—Aaron Weisstuch
*Attorney, Agent, or Firm*—W. G. Fasse

[57] ABSTRACT

A photovoltaic device according to the present invention has a buffer layer on a heat-resistant substrate for enhancing the adhesion characteristic of the substrate, a first semiconductor thin film including polycrystalline silicon of one conductivity type formed by a liquid phase growth method, and a second semiconductor thin film of opposite conductivity type, formed in this order.

11 Claims, 5 Drawing Sheets

PHOTOVOLTAIC DEVICE AND MANUFACTURING METHOD THEREOF

FIELD OF THE INVENTION

The invention relates to photovoltaic devices including a polycrystalline silicon film. The invention also relates to a method for manufacturing such devices.

BACKGROUND INFORMATION

Amorphous silicon and polycrystalline silicon thin films are widely used as semiconductor thin films in solar cells, sensors and so on. Polycrystalline silicon has a carrier mobility which is higher, by one to two orders of magnitude, than that of amorphous silicon. Further, polycrystalline silicon is thermally stable and therefore more reliable than amorphous silicon.

Accordingly, as a photovoltaic device having a polycrystalline silicon thin film, one is known in which single crystalline silicon or cast polycrystalline silicon is used as a substrate material and a polycrystalline silicon thin film is formed on this substrate by a liquid phase growth method, as disclosed in "Solution growth of poly-Si thin films for solar cells" in the Extended Abstracts (The 50th Autumn Meeting, 1989), Japan Society of Applied Physics, p.567.

When single crystalline silicon or polycrystalline silicon is used as a substrate for forming a polycrystalline silicon thin film by the liquid phase growth method as stated above, the cost of the device is extremely high.

Therefore, it would be more economical to employ ceramics, quartz glass, or the like as a substrate material; however, such a substrate has such an inferior adhesion characteristic with the polycrystalline silicon thin film to be grown in a liquid phase that the polycrystalline silicon thin film cannot be formed on the substrate by the liquid phase growth method.

The adhesion characteristic N (wettability) is the percentage of material which is attached to the surface of a substrate. N is defined by the following equation, wherein a value of N of 90% or below is considered as an inferior adhesion characteristic:

$N$ = area to which material is attached/substrate area $\times 100$ (%).

SUMMARY OF THE INVENTION

It is an object of the present invention to provide a photovoltaic device at a low cost.

Another object of the present invention is to provide a photovoltaic device having no particular substrate requirements.

Still another object of the present invention is to provide a photovoltaic device having a high conversion efficiency.

A photovoltaic device in accordance with the present invention includes a heat resistant substrate, an adhesion enhancing layer formed on this substrate for enhancing the adhesion characteristic of the substrate, a first semiconductor thin film including polycrystalline silicon of one conductivity type, formed on said adhesion enhancing layer by a liquid phase growth method, and a second semiconductor thin film of opposite conductivity type formed on the first semiconductor thin film.

A method of manufacturing a photovoltaic device in accordance with the present invention includes the steps of: forming an adhesion enhancing layer on a heat resistant substrate for enhancing the adhesion between the first semiconductor thin film and the substrate; forming a first semiconductor thin film including polycrystalline silicon of one conductivity type on said adhesion enhancing layer by a liquid phase growth method; and forming a second semiconductor thin film of opposite conductivity type on the first semiconductor thin film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
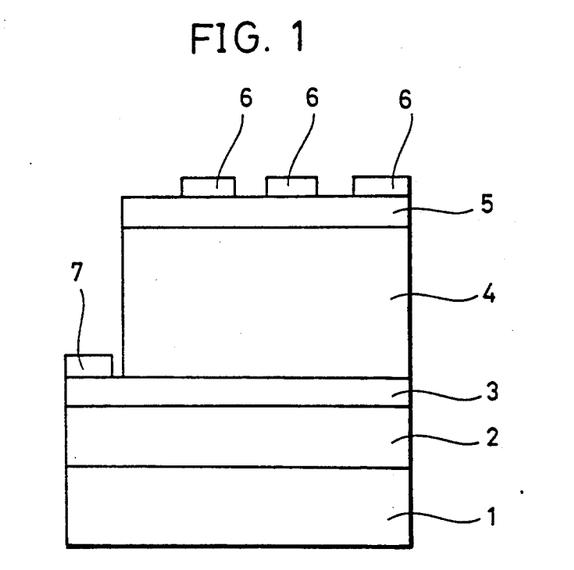
FIG. 1 is a side view showing a first embodiment of the present invention.

FIG. 1 shows an embodiment with a adhesion enhancing layer 2 provided on a substrate 1 made of ceramics or quartz glass. The adhesion enhancing layer 2 is made of a material for enhancing the adhesion characteristic with polycrystalline silicon to be later grown thereon from a liquid phase, for example, including a single layer of a silicon thin film, a silicide thin film, a cermet thin film, or a silicon carbide thin film, or multi-layered films of thin films selected from the above group. On this adhesion enhancing layer 2, there are formed a $p^+$-type polycrystalline silicon thin film 3, a $p^-$-type polycrystalline thin film 4 and an $n^+$-type polycrystalline silicon thin film 5 in this order by the liquid phase growth method.

Furthermore, front surface electrodes 6 of aluminum or the like are formed on the $n^+$-type polycrystalline silicon thin film 4 and and a back electrode 7 is formed on an end portion of the $p^+$-type polycrystalline silicon thin film 3 in ohmic-contact therewith.

Figure 2:
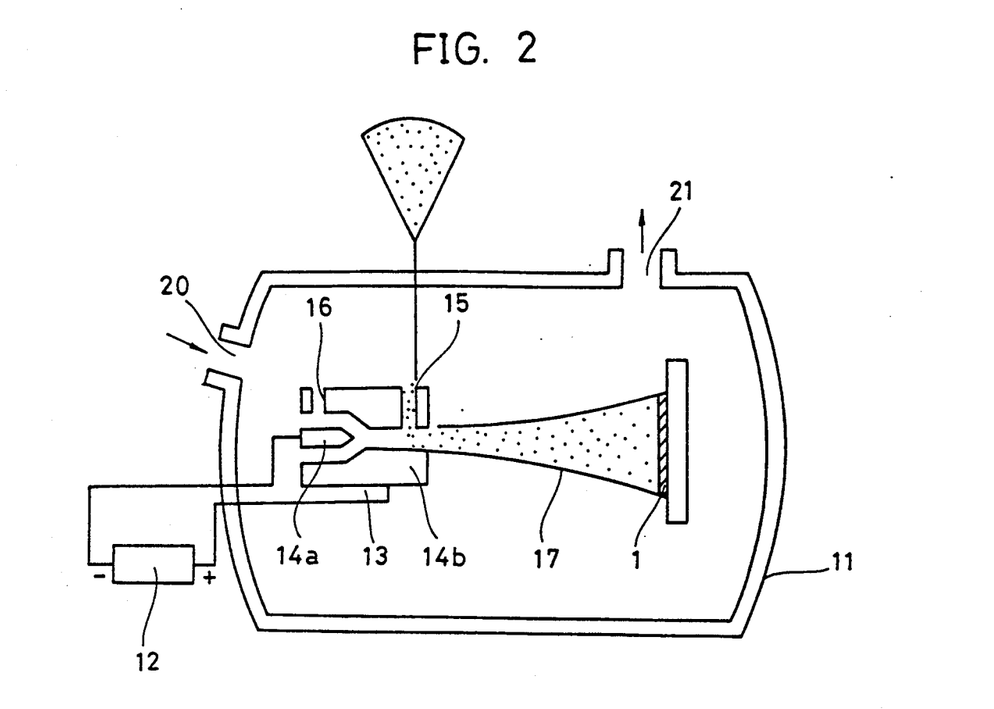
FIG. 2 is a typical diagram showing a low pressure plasma spray apparatus employed in the present invention.
Figure 3:
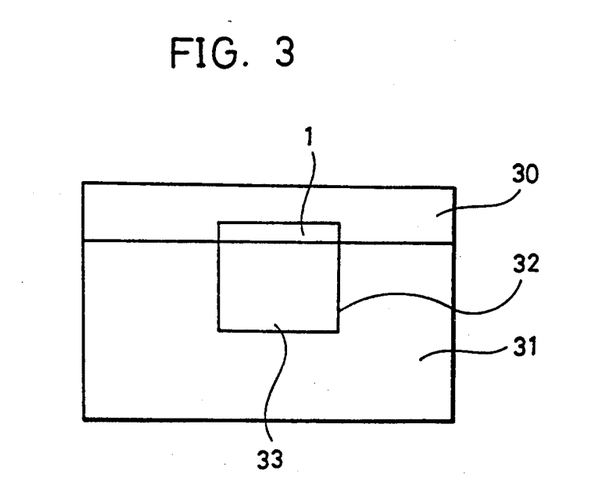
FIG. 3 is a typical diagram showing a liquid phase growth apparatus employed in the present invention.

The adhesion enhancing layer 2 and each of the polycrystalline silicon thin films 3, 4, 5 in this photovoltaic device are formed in a low pressure plasma spray apparatus shown in FIG. 2 and a liquid phase growth apparatus shown in FIG. 3, respectively.

Referring to FIG. 2, a vacuum chamber 11 has disposed therein a cathode 14a and an anode 14b coupled to a direct current power supply 12, constituting a plasma spray gun 13. Powdered material of a thin film to be formed, for example, silicon powder, silicon carbide powder, having a fine grain size of several $\mu$m to several tens of $\mu$m is supplied in the vicinity of the front of the plasma spray gun 13 through a powder supply port 15 and melted by the heat of the DC plasma generated between the cathode 14a and the anode 14b. A plasma gas such as helium, argon, hydrogen, or the like is introduced into the plasma spray gun 13 through a plasma gas introduction port 16, for ejecting the melted powder material as a plasma jet formed of said fine grains, from the plasma spray gun 13. The vacuum chamber 11 is provided with an atmosphere gas introduction port 20 for introducing an atmosphere gas and an exhaust port 21 for evacuating the chamber 11.

Referring now to FIG. 3, a substrate 1 is held on a tray 30 made of high purity carbon, for growing a desired thin film thereon in a liquid phase. Silicon tin (SiSn) 33 is melted in a crucible 32 within a boat 31 also made of high purity carbon. The substrate 1 held on the tray 30 is placed so as to come in contact with the surface of the SiSn solution 33 melted within the crucible 32 of the boat 31.

In this condition, in an atmosphere of hydrogen under an atmospheric pressure, a polycrystalline silicon thin film of about 50 $\mu$m is formed on the substrate 1, by setting the temperature of the crucible, for example, at 1000° C., and then reducing the crucible temperature to 950° C. at a reducing rate of 1° to 2° C. per minute.

A manufacturing method of the first embodiment shown in FIG. 1 will now be described in detail.

First, a heat resistant substrate 1 made of quartz glass or ceramics such as alumina ($Al_2O_3$), aluminum nitride (AlN), Yttria ($Y_2O_3$), magnesia (MgO), and zirconia ($ZrO_2$) is disposed within the low pressure plasma spray chamber 11 shown in FIG. 2. Then, 1 to 310 slm of a mixed gas of argon and hydrogen is introduced through the plasma gas introduction port 16 after evacuating the vacuum chamber 11 to about $10^{-3}$ Torr, and silicon powder having a grain size of 10 to 44 82 m is introduced through the powder supply port 15 at the rate of 1 to 10 g/minute.

Then, electric power of 30 kw is applied to the plasma spray gun 13 from the direct current power supply 12 to generate a plasma jet 17 for depositing an adhesion enhancing layer 2 as a polycrystalline silicon thin film having a thickness of 400 $\mu$m, on the substrate 1. Deposition conditions at this time are as follows: the pressure in the vacuum chamber 11 is 1 to 300 Torr; the temperature of the substrate is 500° to 1000° C.; and the deposition time is 10 minutes.

Referring to FIG. 3, the substrate 1 having the adhesion enhancing layer 2 deposited thereon, is supported on the high purity carbon tray 30 and the tray 30 is placed so that the surface of the SiSn solution 33 melted in the crucible 32 of the high purity carbon boat 31 is in contact with the surface of the adhesion enhancing layer 2 of the substrate 1, whereby the tray 30 and the crucible 32 are maintained in an atmosphere of hydrogen under an atmospheric pressure. At this time, the SiSn solution 33 is, for the most part, tin according to the phase diagram. The silicon source for the melt is p-type single crystalline silicon and its resistivity is 1 $\Omega$cm or less.

Then, after the temperature of the substrate 1 is raised, to 1000° C., it is decreased at a reducing rate of 1° to 2° C. per minute to 950° C. and the substrate 1 is separated from the SiSn solution 33, so that a $p^+$-type polycrystalline silicon thin film 3 having a thickness of 50 $\mu$m is formed on the buffer layer 2 on the substrate 1 by a liquid phase growth. Furthermore, in an atmosphere of hydrogen under an atmospheric pressure in the same manner as stated above, the substrate 1 having the $p^+$-type polycrystalline silicon thin film 3 formed thereon as described above, is supported on the high purity carbon tray 30 and the tray 30 is placed so that the surface of the SiSn solution 33 melted in the crucible 32 of the high purity carbon boat 31, is in contact with the surface of the $p^+$-type polycrystalline silicon thin film 3 of the substrate 1. At this time, the SiSn solution 33 is, for the most part, tin according to the phase diagram. The silicon source for the melt is p-type single crystalline silicon and the resistivity thereof is 5 $\Omega$cm or less.

Then, after raising the temperature of the substrate 1, to 1000° C., it is decreased at a reducing rate of 1° to 2° C. per minute to 900° C. and the substrate 1 is separated from the SiSn solution 33, so that a $p^-$-type polycrystalline silicon thin film 4 having a thickness of 100 $\mu$m, is formed on the $p^+$-type polycrystalline silicon thin film 3 by the liquid phase growth.

Furthermore, an $n^+$-type polycrystalline silicon thin film 5 is formed on the $p^-$-type polycrystalline silicon thin film 4 in the same manner. At this time, the silicon source for the SiSn solution 33 is n-type single crystalline silicon and the resistivity thereof is 1 $\Omega$cm or less.

After the temperature of the substrate 1 has been raised to 1000° C., it is decreased at a reducing rate of 1° to 2° C. per minute to 995° C. and the substrate 1 is separated from the SiSn solution 33 in the same manner as stated above, so that an $n^+$-type polycrystalline silicon thin film 5 having a thickness of 5 $\mu$m is formed on the $p^-$-type polycrystalline silicon thin film 4 by the liquid phase growth.

Thereafter, patterned front surface electrodes 6 and a back electrode 7, which are in ohmic contact with the $n^+$-type polycrystalline silicon thin film 5 and the $p^+$-type polycrystalline silicon thin film 3, respectively, are formed by evaporating aluminum or the like, so that a photovoltaic device according to the first embodiment is completed.

Though a case has been described in which a polycrystalline silicon thin film is employed as the buffer layer 2 in the above-described embodiment, a silicide thin film, a cermet thin film, and a silicon carbide thin film may be employed as the adhesion enhancing layer 2.

The formation of a silicide thin film as the adhesion enhancing layer 2 will now be described.

As a material for forming the silicide thin film, a powder of $TiSi_2$, $VSi_2$, $CrSi_2$, $FeSi_2$, $CoSi_2$ or $NiSi_2$ having a grain size of 10 to 44 $\mu$m is used. The powder of silicide material is introduced through the powder supply port 15 of the plasma melting and injection apparatus shown in FIG. 2 at a rate of 1 to 10 g per minute.

Electric power of 50 kw is applied to the plasma spray gun 13 from the direct current power supply 12 to generate the plasma jet 17 and deposit the adhesion enhancing layer 2 on the substrate 1, having a thickness of 500 $\mu$m and including the silicide thin film.

If a cermet thin film is used as the adhesion enhancing layer 2, the material for forming the cermet thin film is selected as a powder from the group of WC-9%Co, WC-13%Co, WC-15%Co, $Cr_3C_2$-NiCr, $Al_2O_3$-Cr, or $Al_2O_3$-Mo-Cr having a grain size of 10–44 $\mu$m. If the thin film adhesion enhancing layer 2 is made of silicon carbide the material for forming the silicon carbide thin film is SiC powder having a grain size of 10 to 44 $\mu$m. The adhesion enhancing layer 2 including the cermet thin film, or the silicon carbide thin film having a thickness of 500 μm is deposited in the same manner as the silicide thin film described above.

Figure 4:
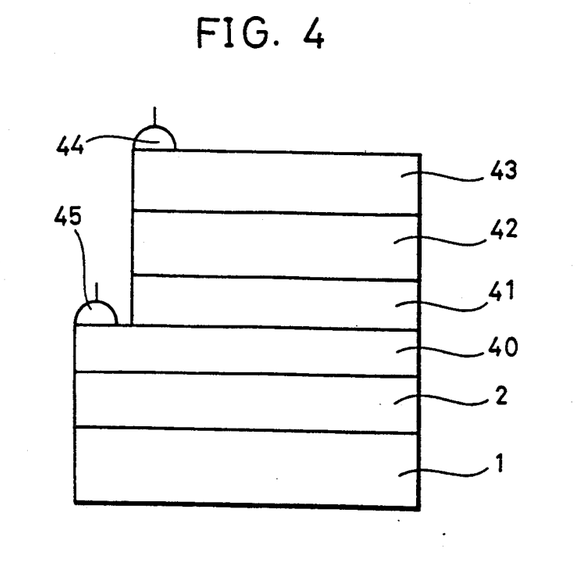
FIG. 4 is a side view showing a second embodiment of the present invention.

A second embodiment according to the present invention will now be described with reference to FIG. 4.

A photovoltaic device in accordance with this embodiment has a so-called tandem structure obtained by stacking a photovoltaic device including polycrystalline silicon and a photovoltaic device including amorphous silicon with an adhesion enhancing layer 2 provided on a substrate 1 made of ceramics or quartz glass. This adhesion enhancing layer 2 is made of material for enhancing the adhesion characteristic (wettability) of the polycrystalline silicon grown thereon from a liquid phase in the same way as in the above-mentioned first embodiment. For example, a single layer is formed as a silicon thin film, a silicide thin film, a cermet thin film, or a silicon carbide thin film, or multi-layered films are formed as thin films selected from the just listed group.

An n-type polycrystalline silicon thin film 40, a p-type polycrystalline silicon thin film 41, and p-, i-, and n-type amorphous silicon thin films, shown as layer 42, are formed on buffer layer 2 in this order.

Furthermore, a transparent electrode 43 including ITO, etc. is formed on the entire surface of the amorphous silicon thin film 42, and a front surface output electrode 44 is formed in contact with electrode 43. A back output electrode 45 is formed at the lower portion of the n-type polycrystalline silicon thin film 40, in ohmic contact with the latter.

A manufacturing method in accordance with the second embodiment shown in FIG. 4 will now be described in detail.

Firstly, a heat-resistant substrate 1 made of quartz glass or ceramics such as alumina ($Al_2O_3$), aluminum nitride (AlN), Yttria ($Y_2O_3$), magnesia (MgO), and zirconia ($ZrO_2$) is placed within the low-pressure plasma spray apparatus shown in FIG. 2. After exhausting the vacuum chamber 11 of the low-pressure plasma spray apparatus to a vacuum of about $10^{-3}$ Torr, 1 to 10 slm of a mixed gas of argon and hydrogen is introduced through plasma gas introduction port 16 and silicon powder, or silicon carbide powder having a grain size of 10 to 44 μm is introduced through the powder supply port 15 at a rate of 1 to 10 g/minute.

Then, electric power of 30 kw is applied to the plasma spray gun 13 from the direct current power supply 12 to generate the plasma jet 17 and deposit an adhesion enhancing layer 2 including a polycrystalline silicon or a polycrystalline silicon carbide thin film having a thickness of 400 μm, on the substrate 1. The deposition conditions at this time are as follows: the pressure within the vacuum chamber 11 is 1 to 10 Torr; the temperature of the substrate is 500° to 1000° C.; and the deposition time is 10 minutes.

Subsequently, in an atmosphere of hydrogen under an atmospheric pressure, the substrate 1 having the adhesion enhancing layer 2 deposited thereon, is supported on the high purity carbon tray 30 and the tray 30 is placed so that the surface of the SiSn solution 33 melted in the crucible 32 of the high purity carbon boat 31, is in contact with the surface of the buffer layer 2 of the substrate 1. At this time, the SiSn solution 33 is, for the most part, Sn according to the phase diagram. The silicon source for the melt is n-type single crystalline silicon and the resistivity thereof is 1 Ω cm or less.

Then, after raising the temperature of the substrate 1, to 1000° C., it is decreased at a reducing rate of 1° to 2° C. per minute to 950° C., and the substrate 1 is separated from the SiSn solution 33, so that at n-type polycrystalline silicon thin film 40 having a thickness of 50 μm is formed on the adhesion enhancing layer 2 of the substrate 1 by the liquid phase growth.

Furthermore, in a similar way as stated above, in an atmosphere of hydrogen under an atmospheric pressure, the substrate 1 having the n-type polycrystalline silicon thin film 40 formed thereon, is supported on the high purity carbon tray 30 and the tray 30 is placed so that the surface of the SiSn solution 33 melted in the crucible 32 of the high purity carbon boat 31, is in contact with the surface of $p^+$-type polycrystalline silicon thin film 3 of the substrate 1. At this time, the SiSn solution 33 is, for the most part, tin according to the phase diagram. The silicon source for the melt is p-type single crystal silicon and the resistivity thereof is 5 Ω cm or less.

After raising the temperature of the substrate 1, to 1000° C., it is decreased at a reducing rate of 1° to 2° C. per minute to 900° C. and the substrate 1 is separated from the SiSn solution 33, so that a p-type polycrystalline silicon thin film 41 having a thickness of 100 μm is formed on the n-type polycrystalline silicon thin film 40 by the liquid phase growth.

Thereafter, the n-type, i-type, and p-type amorphous silicon thin films 42 are formed on the p-type polycrystalline silicon thin film 41, by a plasma CVD method. For example, the n-type amorphous silicon layer is formed by keeping the temperature of the substrate at 200° C., setting the RF output to 0.01 W/cm² and the pressure of 0.1 Torr, using $PH_3/SiH_4=1\%$ as a reactive gas, and reacting for 5-minutes. The i-type amorphous silicon layer is similarly formed by keeping the temperature of the substrate at 200° C., setting the RF output to 0.01 W/cm², and the pressure of 0.1 Torr, using $SiH_4$ as a reactive gas and reacting for 1-hour. The p-type amorphous silicon layer is formed by keeping the temperature of the substrate at 200° C., setting the RF output to 0.01W/cm², and the pressure to 0.1 Torr, using $B_2H_6/SiH_4=0.1\%$ as a reactive gas, and reacting for 5-minutes.

Thereafter, a transparent electrode 43 including ITO is formed on the amorphous silicon thin film 42 by a sputtering method.

Then, the front surface output electrode 44 and the back output electrode 45 made of aluminum, etc. respectively are formed by evaporation.

A manufacturing method according to a third embodiment will now be described in detail with reference to FIGS. 5 to 10.

Figure 5:
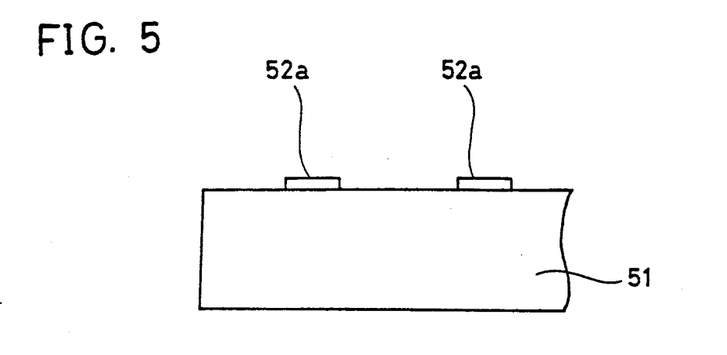
FIGS. 5 to 9 are side views showing a third embodiment of the present invention and illustrating a sequence of manufacturing steps.
Figure 10:
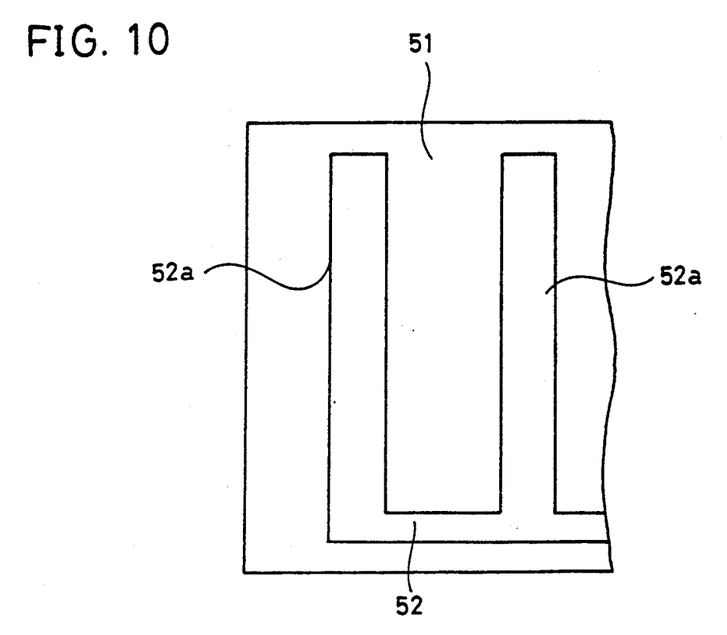
FIG. 10 is a top plan view of a portion of the upper surface of FIG. 5.

Referring to FIG. 5, first, a metal electrode 52 made of aluminum, is formed on a heat-resistant substrate 51 including quartz glass or ceramics such as alumina ($Al_2O_3$), aluminum nitride (AlN), Yttria ($Y_2O_3$), magnesia (MgO), and zirconia ($ZrO_2$). This metal electrode 52 is shaped such that it exposes the surface of the substrate 51 in a patterned manner. For example, as shown in FIG. 10, the electrode 52 is formed to have a configuration with a plurality of comb-like portions 52a or in a lattice.

Figure 6:
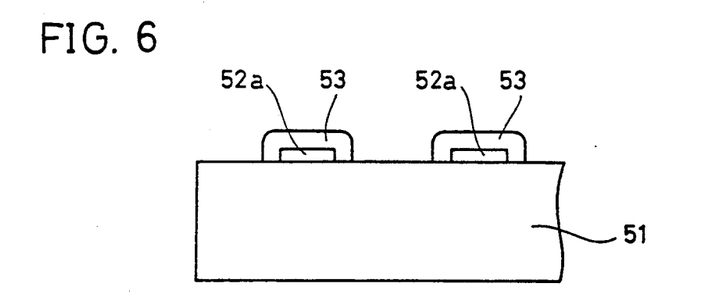

Referring to FIG. 6, the substrate 51 having the metal electrode 52 formed thereon, is placed within the low-pressure plasma spray apparatus shown in FIG. 2. After exhausting the vacuum chamber 11 of the low-pressure plasma spray apparatus to a vacuum of about $10^{-3}$ Torr, 1 to 10 slm of a mixed gas of argon and hydrogen is introduced through the plasma gas introduction port 16, and silicon powder having a grain size of 10 to 44 μm is introduced through the powder supply port 15 at a rate of 1 to 10 g/minute.

Electric power of 30 kw is applied to the plasma spray gun 13 from the direct current power supply 12 to generate the plasma jet 17 and deposit an adhesion enhancing layer including a polycrystalline silicon thin film having a thickness of 30 μm on the substrate 51. The deposition conditions at this time are as follows: the pressure within the vacuum chamber 11 is 1 to 10 Torr; and the temperature of the substrate is 500° to 1000° C. Then, the deposited buffer layer is patterned to form adhesion enhancing layers 53 covering comb portions 52a of the metal electrode 52.

Figure 7:
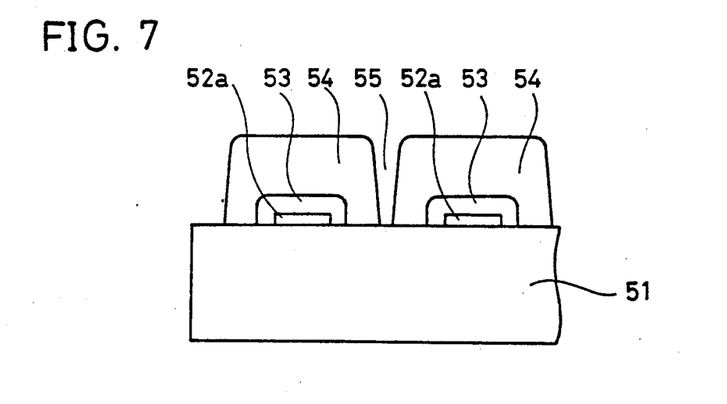

Referring to FIG. 7, in an atmosphere of hydrogen under an atmospheric pressure, in the liquid phase growth apparatus shown in FIG. 3, the substrate 51 having the adhesion enhancing layers 53 deposited thereon, is supported on the high purity carbon tray 30 and the tray 30 is placed so that the surface of the SiSn solution 33 melted in the crucible 32 of the high purity carbon boat 31, is in contact with the surface of the substrate 51. At this time, the SiSn solution 33 is, for the most part, tin according to the phase diagram. The silicon source for the melt is p-type single crystalline silicon and the resistivity thereof is 1 Ωm or less.

After raising the temperature of the substrate 51, to 1000° C., it is decreased at a reducing rate of 1° to 2° C. per minute to 950° C. and the substrate 51 is separated from the SiSn solution 33, whereby p-type polycrystalline silicon thin films 54 having a thickness of 50 μm, are formed by the liquid phase growth, covering the adhesion enhancing layers 53 on the substrate 51.

Selective deposition occurs because the p-type polycrystalline silicon thin films 54 are formed only on the adhesion enhancing layers 53 having a high adhesion characteristic therewith.

At this point, a trench portion 55 is naturally formed along the comb portions 52a of the metal electrode 52 between the p-type polycrystalline silicon thin films 54, by suitably setting the distance between two adjacent adhesion enhancing layers 53 on the comb portions 52a of the metal electrode 52 and the thickness of the p-type polycrystalline silicon thin films 54.

For example, when the width of the comb portions 52a of the metal electrode 52 was 50 μm, the distance between the comb portions 52a was 100 μm, the thickness of the adhesion enhancing layers was 30 μm, and the thickness of the p-type polycrystalline silicon thin films 54 was 50 μm, a trench 55 was formed which exposes a portion of the surface of the substrate 51 with a width of 10 μm. The formation of the configuration of the buffer layers 53 permits said exposing of scattered portions of said substrate.

Figure 8:
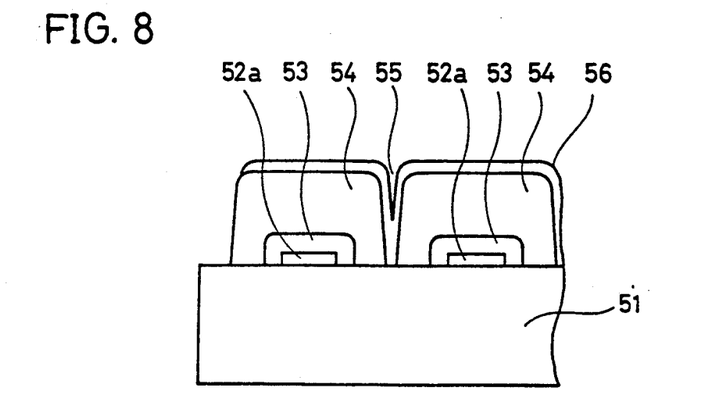

Referring to FIG. 8, in an atmosphere of hydrogen under an atmospheric pressure, the substrate 51 having the p-type polycrystalline silicon thin films 54 formed thereon, is then supported on the high purity carbon tray 30 and the tray 30 is placed so that the surface of the SiSn solution 33 melted in the crucible 32 of the high purity carbon boat 31, is in contact with the substrate 51. At this time, the SiSn solution 33 is, for the most part, tin according to the phase diagram. The silicon source for the melt is n-type single crystalline silicon and the resistivity thereof is 5 Ωcm or less.

In the same way as stated before, after increasing the temperature of the substrate 51, to 1000° C, it is decreased at a reducing rate of 1° to 2° per minute to 990° C. and the substrate 51 is separated from the SiSn solution 33, so that an n-type polycrystalline silicon thin film 56 having a thickness of 10 μm, is formed on the p-type polycrystalline silicon thin films 54 by the liquid phase growth. This n-type polycrystalline silicon thin film 56 is so formed that the trench portion 55 of the p-type polycrystalline silicon thin films 54 remains. As a result, the depth of the trench portion 5 is 50 μm.

An n-type amorphous silicon thin film may be used in place of this n-type polycrystalline silicon thin film 56.

Figure 9:
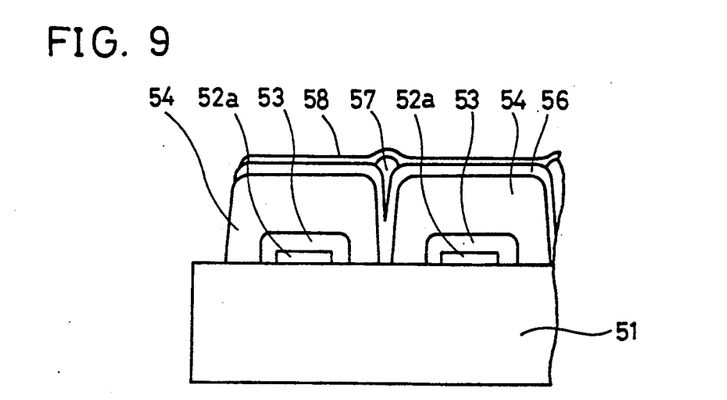

Referring to FIG. 9, a patterned contact electrode 57 is formed by evaporating aluminum, etc. so as to fill up the trench portion 55 having a depth of 50 μm. For example, this contact electrode 57 is formed to have a surface width of 20 μm. Furthermore, an anti-reflection film 58 such as silicon oxide, silicon nitride, or the like is formed so as to cover the n-type polycrystalline silicon thin film 56 and the contact electrode 57 to thereby form a photovoltaic device.

Figure 11:
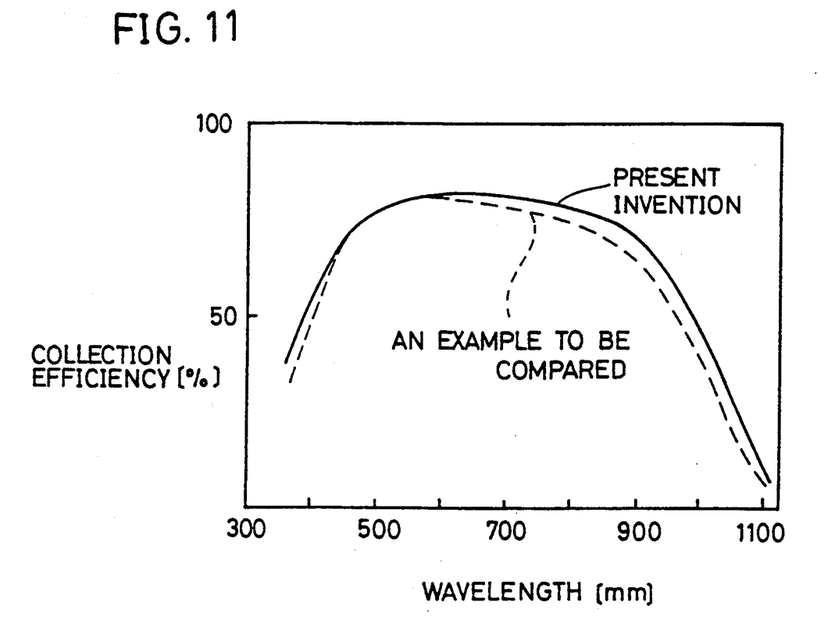
FIG. 11 is a graph showing the characteristic of the collection efficiency of the third embodiment of the present invention as a function of the wavelength of the incident light.

In FIG. 11, the solid line indicates the collection efficiency of the device according to the third embodiment, and the broken line represents the characteristic of a comparison device. In the comparison device the metal electrode 52 and the adhesion enhancing layer 53 are uniformly formed on the entire surface of the substrate 51, so that the trench portion 55 is not formed between the p-type polycrystalline silicon thin films 54 and between the n-type polycrystalline silicon thin films 56.

Referring to the figures, in accordance with the third embodiment, it can be seen that the semiconductor junction between the p-type polycrystalline silicon thin films 54 and the n-type polycrystalline silicon thin film 56 and the contact electrode 57 both extend to the internal portion of the device, so that light of long wavelengths, which is absorbed at the internal portions of the device, can be efficiently collected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photovoltaic device, comprising: a heat resistant substrate; an adhesion improving layer formed on said substrate for enhancing the adhesion characteristic and wettability of the substrate; a first semiconductor thin film comprising polycrystalline silicon of one conductivity type formed on said adhesion improving layer by a liquid phase growth method; a second semiconductor thin film of opposite conductivity type formed on said first semiconductor thin film, and wherein said adhesion improving layer is formed in a configuration such that said adhesion improving layer exposes scattered portions of the surface of said substrate, said adhesion improving layer being formed of a material selected from the group consisting of silicon, silicide, cermet, and silicon carbide.

2. The photovoltaic device of claim 1, wherein said heat-resistant substrate comprises glass or ceramics.

3. The photovoltaic device of claim 1, wherein said adhesion improving layer includes a single layer film or a multilayer film of a thin film or thin films selected from the group consisting of a silicon thin film, a silicide film, a cermet thin film, and a silicon carbide thin film.

4. The photovoltaic device of claim 1, wherein a portion of said first semiconductor layer corresponding to an exposed surface portion of said substrate, includes a concave portion.

5. The photovoltaic device of claim 4, wherein a portion of said second semiconductor layer opposite to the concave portion of the first semiconductor layer, includes a concave portion.

6. The photovoltaic device of claim 5, further comprising an electrode formed in the concave portion of said second semiconductor layer.

7. A method of manufacturing a photovoltaic device, comprising the following steps: forming on a heat-resistant substrate an adhesion improving layer made of a material selected from the group consisting of silicon, silicide, cermet, and silicon carbide for enhancing the adhesion characteristic and wettability of said substrate, said forming step being performed so that said adhesion improving layer is configured for exposing scattered portions of said substrate; forming a first semiconductor thin film including polycrystalline silicon of one conductivity type on said adhesion improving layer by a liquid phase growth method; and forming a second semiconductor thin film of opposite conductivity type on said first semiconductor thin film.

8. The method of claim 7, wherein said adhesion improving layer is formed by low-pressure plasma spray method.

9. The method of claim 7, wherein said first semiconductor layer is so formed that a portion corresponding to an exposed surface portion of said substrate includes a concave portion.

10. The method of claim 9, wherein said second semiconductor layer is so formed that a portion opposite to said concave portion of said first semiconductor layer also includes a concave portion.

11. The method of claim 10, further comprising a step of forming an electrode in the concave portion of said second semiconductor layer.

* * * * *

UNITED STATES PATENT AND TRADEMARK OFFICE
CERTIFICATE OF CORRECTION

PATENT NO.   :  5,211,761
DATED        :  May 18, 1993
INVENTOR(S)  :  Shigeru Noguchi et al.

It is certified that error appears in the above-identified patent and that said Letters Patent is hereby corrected as shown below:

Column 8, line 65, after "silicide" insert --thin--,

Column 9, line 5, replace "the" (both instances) by --said--,

Column 10, line 6, after "by" insert --a--.

Signed and Sealed this

Twenty-first Day of December, 1993

Attest:

BRUCE LEHMAN

Attesting Officer

Commissioner of Patents and Trademarks